United States Patent [19]
Nishitani et al.

[11] Patent Number: 4,597,827
[45] Date of Patent: Jul. 1, 1986

[54] METHOD OF MAKING MIS FIELD EFFECT TRANSISTOR HAVING A LIGHTLY-DOPED REGION

[75] Inventors: Akito Nishitani; Yoshiaki Katakura, both of Tokyo, Japan

[73] Assignee: Oki Electric Industry Co., Ltd., Tokyo, Japan

[21] Appl. No.: 704,012

[22] Filed: Feb. 21, 1985

[30] Foreign Application Priority Data

Feb. 29, 1984 [JP] Japan .................................. 59-36252

[51] Int. Cl.⁴ ................... H01L 21/306; H01L 21/22; B44C 1/22; C03C 15/00
[52] U.S. Cl. ...................... 156/643; 29/571; 29/576 B; 29/580; 148/187; 156/651; 156/653; 156/657; 156/662; 357/41; 357/91
[58] Field of Search ..................... 29/571, 576 B, 580, 29/591; 148/1.5, 187; 357/23, 41, 91; 204/192 N; 156/643, 646, 651, 653, 657, 659.1, 661.1, 662

[56] References Cited

U.S. PATENT DOCUMENTS

| | | | |
|---|---|---|---|
| 4,442,589 | 4/1984 | Doo et al. | 29/571 |
| 4,455,738 | 6/1984 | Houston et al. | 29/571 |
| 4,478,679 | 10/1984 | Chang et al. | 156/653 |

OTHER PUBLICATIONS

IEDM-82, 1982, A Half Micron Mosfet Using Double Implanted LDD, Seiki Ogura et al., pp. 718-721.

Primary Examiner—William A. Powell
Attorney, Agent, or Firm—Wenderoth, Lind & Ponack

[57] ABSTRACT

An LDD MIS structure without a lightly-doped source region can be formed by the use of the conventional self-alignment technique. The structure includes in a silicon substrate a gate region, a heavily-doped drain region, a heavily-doped source region, and a lightly doped drain region. The gate region consists of a gate electrode and a side-wall spacer. The lightly-doped drain region is formed under the side-wall spacer, and in the silicon substrate.

6 Claims, 14 Drawing Figures

METHOD OF MAKING MIS FIELD EFFECT TRANSISTOR HAVING A LIGHTLY-DOPED REGION

BACKGROUND OF THE INVENTION

This invention relates to a method of making a metal-insulator-semiconductor (MIS) transistor having a lightly-doped drain (LDD) region.

The self-aligned gate process has commonly been used to manufacture MIS integrated circuit (IC) devices, and has remarkably miniaturized MIS transistor elements, thereby improving the performance of the MIS integrated circuit.

As the channel length is reduced to less than 1 μm, the short channel effect occurs as a result of a two-dimensional potential distribution and high electric fields in the channel region. This phenomenon causes the generation of hot electrons in the channel region and entry of the hot electrons into the gate insulating layer. This varies the threshold voltage, inducing the erroneous operation of the MIS transistors.

It may be considered to decrease the voltage value of the conventional 5-volt power supply voltage. However, it is difficult to use a lowered power supply voltage, because MIS IC devices are required to have TTL logic level compatibility with bipolar IC devices and higher immunity against external noise, and it is not desired by circuit designers to increase the number of power supply.

To overcome such problems, PAUL J. TSANG et al disclosed an improved method for making MIS transistors in his paper entitled "Fabrication of High-Performance LDDFETs with Oxide Sidewall-spacer Technology", issued by IEEE JOURNAL OF SOLID-STATE CIRCUITS, VOL. SC-17, No. 2, APRIL 1982, p 220–226. FIG. 1 show the MIS transistor having lightly-doped drain/source regions according to the process.

In FIG. 1, the gate oxide film 12 is formed over the surface of the P-type silicon substrate 10, and the silicon gate electrode 14 is formed on the surface of the gate oxide 12. The lightly-doped N⁻ regions 16 and 18 are formed by implanting N-type impurity ions with the use of the gate electrode 14 as a mask.

The gate wall spacers 20 and 22 are formed on the side walls of the gate electrode 14 by anisotropically etching a polycrystalline silicon layer formed by chemical vapor deposition (CVD). The heavily-doped N+ regions 24 and 26 are formed by using the sidewalls 20 and 22 as a diffusion mask.

The process described above is featured by the fact that the MIS FET having the LDD structure can be formed by using a self-alignment technique. The lightly-doped N⁻ region 16 extending the drain region 24 functions to weaken the electric field in the channel region.

However, according to this prior art process, the lightly-doped N⁻ region 18 extending from the source region 26 serves only as a resistance component in the channel region, resulting in a lowerd mutual conductance (gm) of the MOS FET. Also, it has been difficult to form oly the lightly-doped N⁻ region extending from the drain region in the MIS transistor area without spoiling the advantages of the self-aligned silicon gate process.

SUMMARY OF THE INVENTION

It is therefore the object of this invention to provide an improved method of making LDD MIS field effect transistors having only lightly-doped drain regions by using the silicon self-aligned gate process.

It is another object of this invention to provide a method of making LDD MIS field effect transistors which have higher mutual transconductance (gm).

The present invention provides a method of making LDD MIS filed effect transistors having a lightly-doped region in a semiconductor substrate of one conductivity type, comprising the steps of; forming a gate insulating layer on a major surface of the semiconductor substrate; forming a masking layer on the gate insulating layer; forming an opening in a selected portion of the masking layer; forming a conductive layer on the major surface of the structure obtained above; anisotropically etching said conductive layer till the surface the gate insulating layer is exposed, to form two spaced gate electrodes in the opening and at the opposite ends of the masking layers; ion-implanting impurities of an opposite conductivity type into the surface of the semiconductor substrate through the gate insulating layer to form a lightly-doped region in the opening; forming an insulating layer on the major surface of the structure obtained above; anisotropicaly etching the insulating layer to expose the surface of the gate insulating layer; thereby forming two spaced side-wall spacers on one ends of the gate electrodes; completely removing the masking layer to form two spaced gate regions, each consisting of a composite structure of the gate electrode and the side-wall spacer; and ion-implanting impurities of the opposite conductivity type into the semiconductor substrate by the use of the gate regions as a masking layer to form a heavily-doped drain region between the spaced gate reagions, while heavily-doped source regions are formed outside the gate regions in the semiconductor substrate, whereby the lightly-doped drain region is formed under the side-wall spacer.

In addition, the present invention provides a method of making CMOS structure having lightly-doped drain regions in a silicon substrate of one conductivity type, comprising the steps of: forming a first region as a well of an opposite conductivity type in the silicon substrate, the first region being isolated from a second region of the silicon substrate by a thick silicon oxide region; forming a gate insulating layer on the substrate; forming a masking layer on the insulating layer; forming an opening in the masking layer, the opening exposing the gate insulating layer over a first selected portion of the first region and over a second selected portion of the second region; forming a conductive layer on the insulating layer; subjecting the structure obtained above to an anisotropic process to form two spaced gate electrodes in the opening and on opposite vertical ends of the masking layer; ion-implanting impurities of the one conductivity type into the first region to form a first lightly-doped region, and ion-implanting impuities of the opposite conductivity type into the second region to form a second lightly-doped region; forming an insulating layer on the structure above; subjecting the insulating layer to an anisotropic etching process to form two spaced side-wall spacers on the ends of the gate electrode; completely removing the exposed masking layer to form two spaced gate regions, each consisting of a composite structure of the gate electrode and the side-wall spacer; and ion-implanting impurities of one conductivity type into the first region by the use of the gate region as a mask to form a heavily-doped drain region and a heavily-doped source region, and ion-implanting impurities of the opposite type into the second region to form a heavily-doped drain region and a heavily-doped source region, whereby the lightly-doped drain regions are formed under the first and second side-wall spacers, respectively.

The above and other objects, features, and advantages of the invention will be more apparent from the ensuring detailed description taken in conjunction with the accompanying drawings

BRIEF DESCRIPTION OF THE INVENTION

FIG. 1 is a cross-sectional view showing a prior art LDD MIS field effect transistor which has lightly-doped source and drain regions;

FIGS. 2(a) to 2(e) are cross-sectional views showing different steps of making a LDD MIS field effect transistor according to this invention; and FIGS. 3(a) to 3(h) are cross-sectional views showing different steps of making a LDD MIS field effect transistor according to another embodiment of this invention.

DETAILED DESCRIPTION

FIGS. 2(a) through 2(e) show an improved process for making a MIS transistor having a lightly-doped drain region according to this invention.

Figure 1:
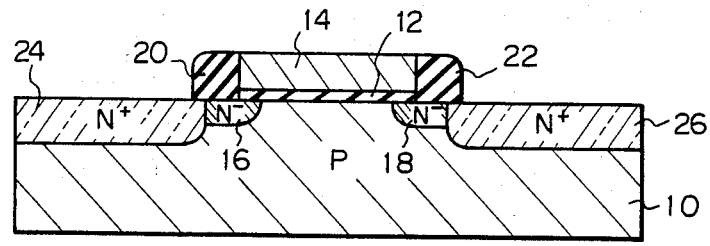
Figure 2A:
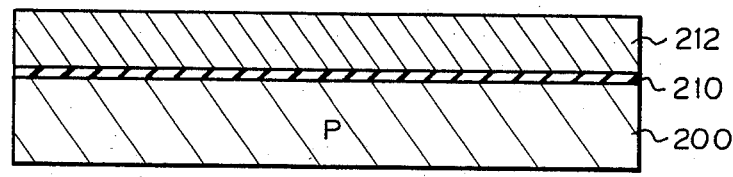

In FIG. 2(a), first, a silicon oxide layer 210 is thermally grown on the major surface of a P-type silicon substrate 200. The oxide layer 210 has preferably a thickness of about 200 Å and is intended as a gate insulating layer.

Then, a silicon nitride layer 212 having, for example, a thickness of 7000 Å is formed by a chemical vapor deposition process. The silicon nitride layer 212 acts as a masking layer against N-type impurities during the subsequent diffusion steps.

Figure 2B:
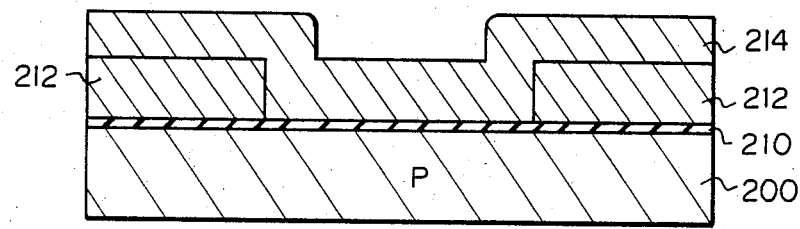

Next, as shown in FIG. 2(b), the silicon nitride layer 212 is selectively etched off to form an opening therein exposing a surface of the silicon oxide layer 210.

Then, a conductive material layer 214 is formed on the structure obtained above. For example, the layer 214 is about 7000 Å in thickness, and is formed by chemically depositing polycrystalline silicon containing impurities. The polycrystalline silicon layer is intended as a gate electrode of the MIS FET, and may be replaced with molybdenum siliside, tungsten siliside, or the like.

Figure 2C:
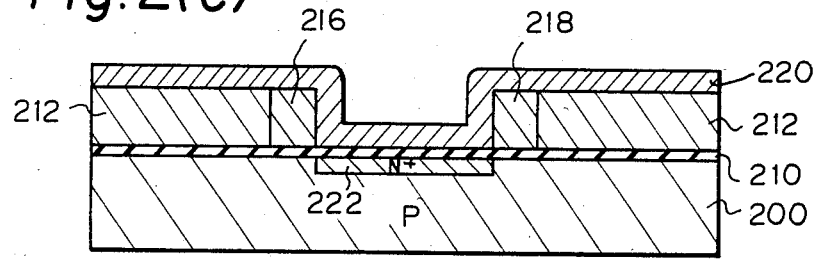
Figure 2D:
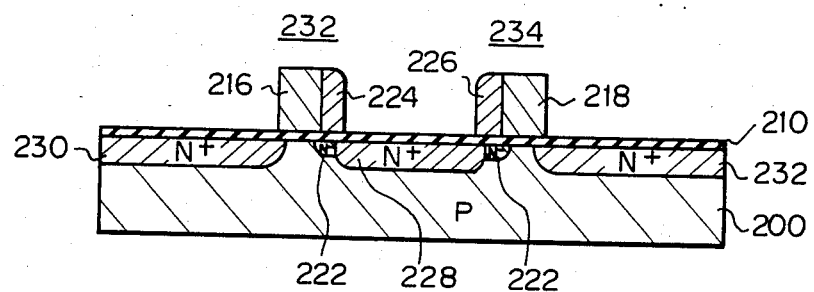

Next, the structure obtained above is subjected to an anisotropic etching process till the surface of the silicon nitride layer 212 is exposed. As a result, two spaced gate electrode 216 and 218 is formed as shown in FIG. 2(c). Reactive ion etching (RIE) may be used as the anisotropic etching process.

Then, a lightly-doped N-type region 222 is formed in the surface of the silicon substrate 200 by ion-implanting N-type impurities at a dose of about $1 \times 10^{16}$ to $1 \times 10^{19}$ atoms cm$^{-3}$, preferably about $1.0 \times 10^{18}$ atoms cm$^{-3}$.

Next, an insulating material layer such as SiO$_2$ is chemically deposited to form an insulating layer 220 on the structure obtained above (see FIG. 2(c)). The CVD SiO$_2$ layer 220 is preferably about 3000 Å in thickness.

Next, the insulating layer 220 is subjected to a RIE process to form side-wall spacers 224 and 226 on the ends of the gate electrode 216 and 218, respectively, while the surface of the silicon nitride layer 210 is exposed.

Then, the CVD silicon nitride layer 210 is completely removed by using conventional plasma etching process so as to leave two spaced gate regions 232 and 234, each comprising the side-wall spacer and the gate electrode on the surface of the gate insulating layer 210.

Next, by using as a mask both the gate electrode 216, 218 and the side-wall spacers 224, 226, N-type impurities are ion-implanted to the surface of the silicon substrate 200 at a dose of at least of about $1 \times 10^{19}$ atoms cm$^{-3}$, preferably $1 \times 10^{21}$ atoms cm$^{-3}$, to form a heavily-doped drain region 228 and heavily-doped source regions 230 and 232. In this step, the lightly-doped regions 222 leave under the side-wall spacers 224 and 226 (see FIG. 2(d)).

Figure 2E:
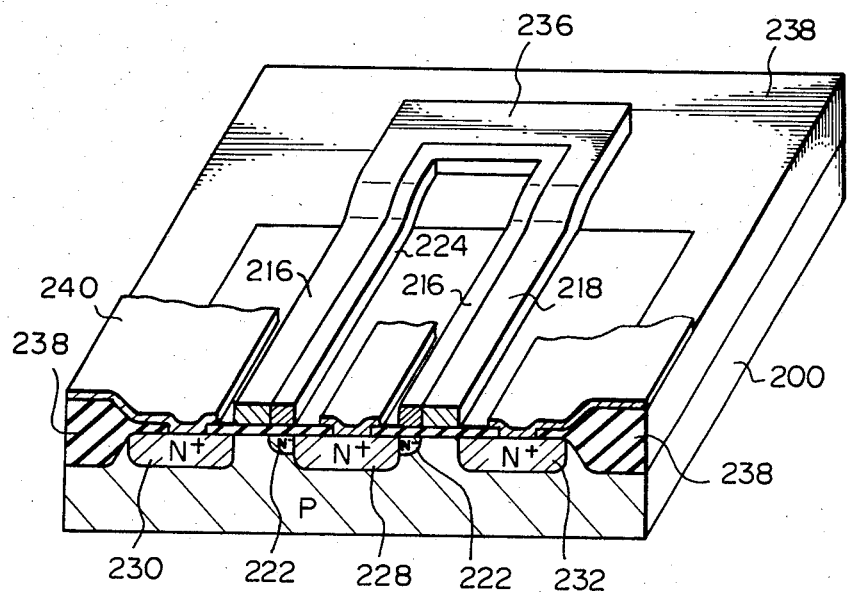

After this, by using the conventional IC wafer process, openings are formed in the gate insulating layer 210 to enable electrical contact with conductive layers 240 as shown in FIG. 2(e).

By the steps according to this invention, lightly-doped N-type region can be formed only on one side of the drain region by using the silicon self-aligned silicon gate process without increasing additional photomask alignment process. Since the gate regions 232 and 234 are formed so as to connect together one another as shown in FIG. 2(e), the LDD MIS device has a doubled gate length. If desired, two MIS FET devices can be fomed by removing the connecting conductive portion 236 on the field oxide region 238.

FIGS. 3(a) to 3(h) show another embodiment, which shows that this invention is also applicable to a CMOS (complimentary metal oxide semiconductor) structure.

Figure 3A:
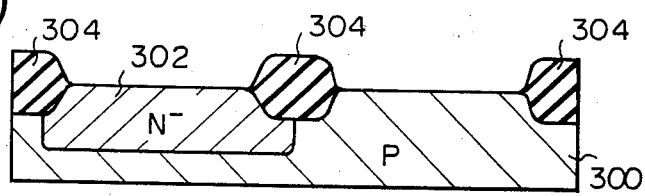

In FIG. 3(a), first, an N-type well 302 is formed in a selected surface of a P-type silicon substrate 300. Then, a thick silicon oxide region 304 is selectively thermally grown on the silicon substrate to define element regions.

Figure 3B:
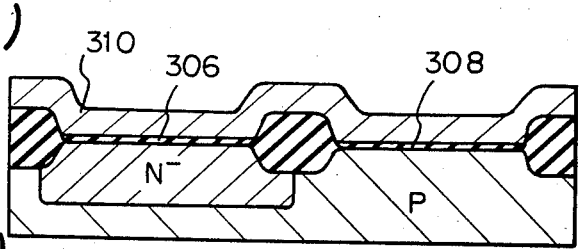

Next, as shown in FIG. 3(b), gate oxide layers 306 and 308 are thermally grown on the surface of the silicon substrate 300, and then silicon nitride layer 310 as a masking layer is deposited over the surface of the silicon substrate 300.

Figure 3C:
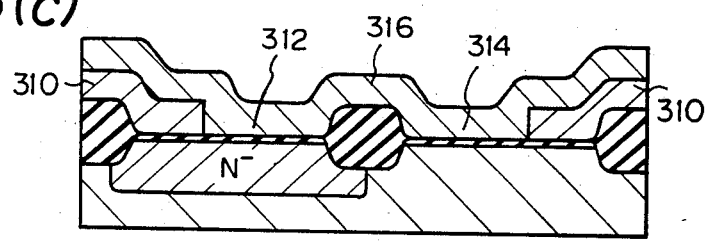

Then, as shown in FIG. 3(c), the silicon nitride layer 310 is selectively etched off to form openings 312 and 314. A conductive layer 316 is formed over the surface of the structure obtained above. The conductive layer may be of CVD polycrystalline silicon.

Figure 3D:
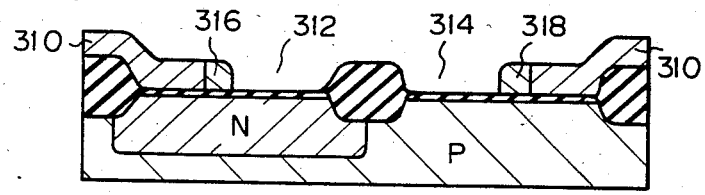

Next, as shown in FIG. 3(d), the structure obtained above is subjected to an anisotropic etching process to form gate electrode 316 and 318.

Figure 3E:
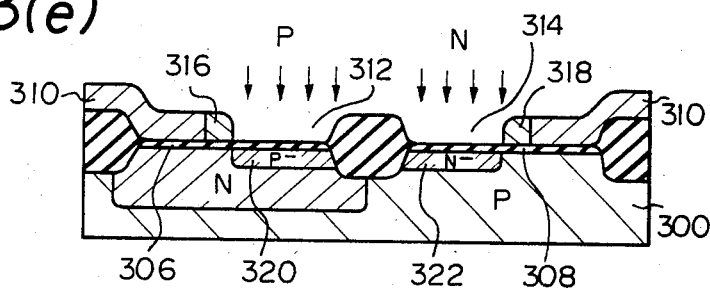

Next, as shown in FIG. 3(e), a lightly-doped P$^-$ drain region 320 is formed by ion-implanting P-type impurities through the gate insulating layer 306, and then a lightly-doped N$^-$ drain region 322 is formed by ion-implanting N-type impurities through the gate insulating layer 308.

Figure 3F:
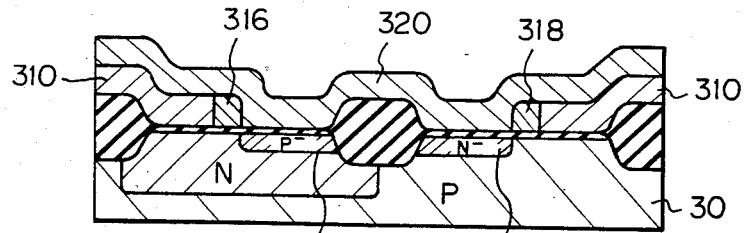

Then, as shown in FIG. 3(f), an insulating material layer such as CVD SiO$_2$ is deposited over the surface of the silicon substrate 300.

Figure 3G:
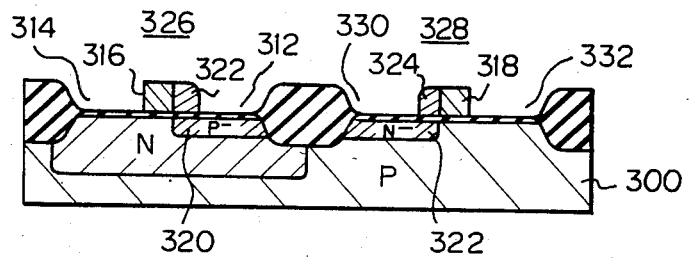

Next, as shown in FIG. 3(g), the layer 320 is subjected to a RIE process to form side-wall spacers 322 and 324 on the ends of the gate electrodes 316 and 318, respectively, while the surface of the layer 310 is exposed. The layer 310 is completely removed by conventional plasma etching process so as to leave two gate regions 326 and 328, each comprising the side-wall spacer and the gate electrode.

Figure 3H:
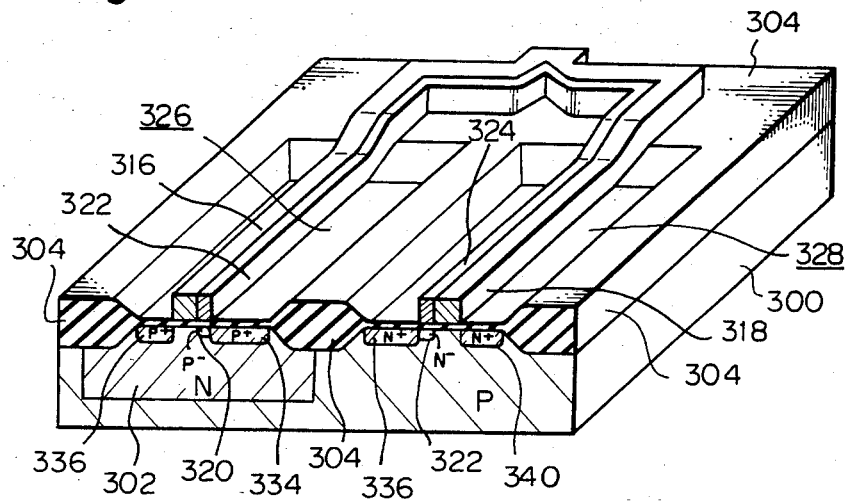

Then, as shown in FIG. 3(h), by using as a mask the gate regions 326, P-type impurities are ion-implanted to the surface of the openings 312 and 314 to form a heavily-doped drain region 334 and a heavily-doped source region 336. After this, by using as a mask the gate region 328, N-type impurities are ion-implanted to the surface of into the openings 330 and 332 to form a heavily-doped drain region 330 and a heavily-doped source region 340. As a result, the P− and N type LDD MIS transistor regions are formed in the silicon substrate 300. The structure obtained above is subjected to anneled to activate the ion-implanted regions.

As described above, according to this invention, LDD MIS transitors without a lightly-doped source region can be made by the use of the conventional silicon gate selfalignment process, and without the increase of the number of photomask alignment step. This method can provide LDD MIS transistors having improved mutual transconductance and reduced short channel effect.

What claimed is:

1. A method of making MIS field effect transistors having a lightly-doped drain region in a semiconductor of one conductivity type, comprising the steps of:
    (a) forming a gate insulating layer on a major surface of said semiconductor substrate;
    (b) forming a masking layer on said gate insulating layer;
    (c) forming an opening in a selected portion of said masking layer;
    (d) forming a conductive layer on the major surface of the structure obtained above;
    (e) anisotropicaly etching said conductive layer till the surface of said gate insulating layer is exposed, to form two spaced gate electrodes in said opening and at the opposite ends of said masking layers;
    (f) ion-implanting impurities of an opposite conductivity type into the surface of said semiconductor substrate through said gate insulating layer to form a lightly-doped region beneath said opening;
    (g) forming an insulating layer on the major surface of the structure obtained above;
    (h) anisotropicaly etching said insulating layer to expose the surface of said gate insulating layer, thereby forming two spaced side-wall spacers on one ends of said gate electrodes;
    (i) completely removing said exposed masking layer to form two spaced gate regions, each consisting of a composite structure of said gate electrode and said side-wall spacer; and
    (j) ion-implanting impurities of the opposite conductivity type into said semiconductor substrate by the use of said gate regions as a masking layer to form a heavily-doped drain region between said spaced gate regions, while heavily-doped source regions are formed outside said gate regions in said semiconductor substrate, whereby said lightly-doped drain region is formed under said side-wall spacer.

2. A method as claimed in claim 1, wherein said semiconductor substrate is a P-type silicon substrate.

3. A method as claimed in claim 2, wherein said step (d) comprises the step of depositing a material selected from the group consisting of polycrystalline silicon, No-Si, and Ta-Si.

4. A method as claimed in claim 2, wherein said step (g) comprises the step of chemically depositing silicon oxide material.

5. A method as claimed in claim 2, wherein said step (f) comprises the step of ion-implanting N-type impurities at a dose of $1 \times 10^{16}$ atoms cm$^{-3}$, and said step (j) comprising the step of ion-implanting N-type impurities at a dose of at least of $1 \times 10^{19}$ atoms cm$^{-3}$.

6. A method of making CMOS structure having lightly-doped drain regions in a silicon substrate of one conductivity type, comprising the steps of:
    (a) forming a first region as a well of an oppsite conductivity type in said silicon substrate, said first region being isolated from a second region of said silicon substrate by a thick silicon oxide region;
    (b) forming a gate insulating layer on said substrate;
    (c) forming a masking layer on said insulating layer;
    (d) forming an opening in said masking layer, said opening exposing said gate insulating layer over a first selected portion of said first region and over a second selected portion of said second region;
    (e) forming a conductive layer on said gate insulating layer;
    (f) subjecting the structure obtained above to an anisotropic etching process to form two spaced gate electrodes in said opening and on opposite vertical ends of said masking layer;
    (g) ion-implanting impurities of the one conductivity type into said first region to form a first lightly-doped region, and ion-implanting impurities of the opposite conductivity type into said second region to form a second lightly-doped region;
    (h) forming an insulating layer on the structure obtained above;
    (i) subjecting said insulating layer to an anisotropic etching process to form two spaced side-wall spacers on one ends of said gate electrode;
    (j) completely removing said exposed masking layer to form two spaced gate regions, each consisting of a composite structure of said gate electrode and said side-wall spacer; and
    (k) ion-implanting impurities of one conductivity type into said first region by the use of said gate region as a mask to form a heavily-doped drain region and a heavily-doped source region, and ion-implanting impurities of the opposite type into said second region to form a heavily-doped drain region and a heavily-doped source region, whereby said lightly-doped drain regions are formed under said first and second side-wall spacers, respectively.

* * * * *